United States Patent
Gewelber

(12) 
(10) Patent No.: US 6,221,507 B1
(45) Date of Patent: Apr. 24, 2001

(54) HIGH TEMPERATURE LAMINATED STRUCTURAL PANELS AND METHOD OF PRODUCING THE SAME

(75) Inventor: Ytzhak Gewelber, Paramount, CA (US)

(73) Assignee: Lockhart Industries, Paramount, CA (US)

( * ) Notice: Subject to any disclaimer, the term of this patent is extended or adjusted under 35 U.S.C. 154(b) by 0 days.

(21) Appl. No.: 09/287,541

(22) Filed: Apr. 6, 1999

(51) Int. Cl.[7] ............... B32B 3/24; B32B 15/20; B23K 1/00
(52) U.S. Cl. ............ 428/608; 428/614; 428/652; 428/653; 228/160; 228/174; 228/190; 228/252
(58) Field of Search ................. 228/190, 252, 228/221, 160, 170, 174; 428/614, 609, 653, 652, 685, 680, 608, 596

(56) References Cited

U.S. PATENT DOCUMENTS

| | | | |
|---|---|---|---|
| 1,956,233 | * | 4/1934 | Braun ................ 428/614 |
| 3,010,398 | * | 11/1961 | Parlanti ............. 428/653 |
| 3,031,996 | * | 5/1962 | Botvin .............. 428/614 |
| 3,310,388 | * | 3/1967 | Bennett et al. ...... 228/190 |
| 3,406,446 | * | 10/1968 | Muldovan ........... 228/190 |
| 4,035,536 | * | 7/1977 | Morrison ........... 428/593 |
| 4,465,725 | * | 8/1984 | Riel ................ 428/116 |
| 4,753,850 | * | 6/1988 | Ibe et al. .......... 228/190 |
| 5,106,433 | * | 4/1992 | Nakamura et al. .... 428/614 |
| 5,192,623 | * | 3/1993 | Gewelber ........... 428/593 |
| 5,197,556 | * | 3/1993 | Jordan ............. 175/432 |
| 5,425,494 | * | 6/1995 | Rosenthal et al. ... 228/190 |
| 5,506,062 | * | 4/1996 | Flammang .......... 428/614 |

* cited by examiner

Primary Examiner—John J. Zimmerman
(74) Attorney, Agent, or Firm—John E. Wagner; Robert C. Smith

(57) ABSTRACT

A laminated structural panel is formed of top, bottom, and one or more intermediate layers of material having low strength at high temperature and with perforated high temperature, high strength materials interleaved between the top, bottom and intermediate layers. Brazing material is clad on the top and bottom layers and the intermediate layer or layers may be entirely of brazing material or clad on both sizes with brazing material, such that when the assembled stack is subjected to high temperature in a high vacuum environment brazing material is caused to melt and fill the perforations in the high strength material. A particular application is for structural panels, used as shelves in manufacturing electronic chips or displays where aluminum is advantageous because it does not outgas or release particles under the high temperature, high vacuum environment used to make the product. Aluminum, however, does not maintain its strength and stiffness at the high temperatures involved. To provide the strength so that the structural panels do not bend under load at high temperatures, the perforated layers of Inconel, stainless steel or magnetic material are incorporated and brazed in place so that they are completely covered by aluminum. Thus they are not exposed to the high temperature, high vacuum environment and cannot contaminate the product.

23 Claims, 2 Drawing Sheets

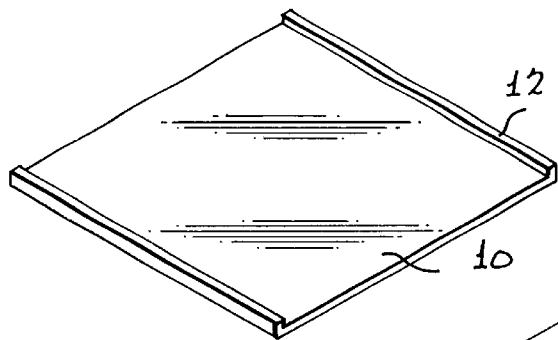
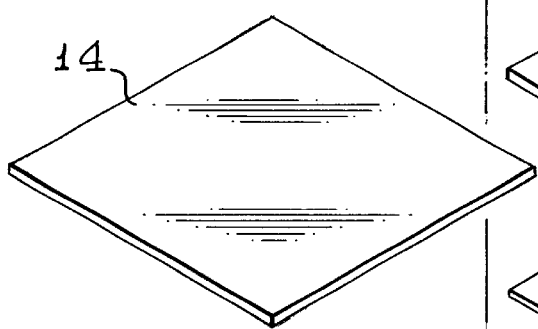
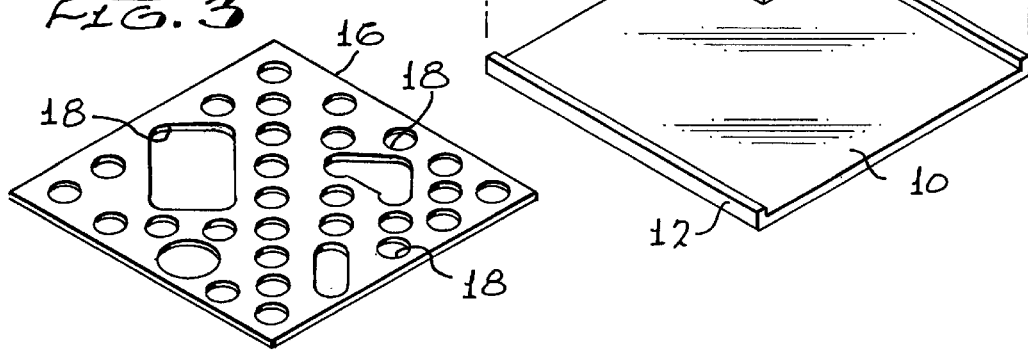
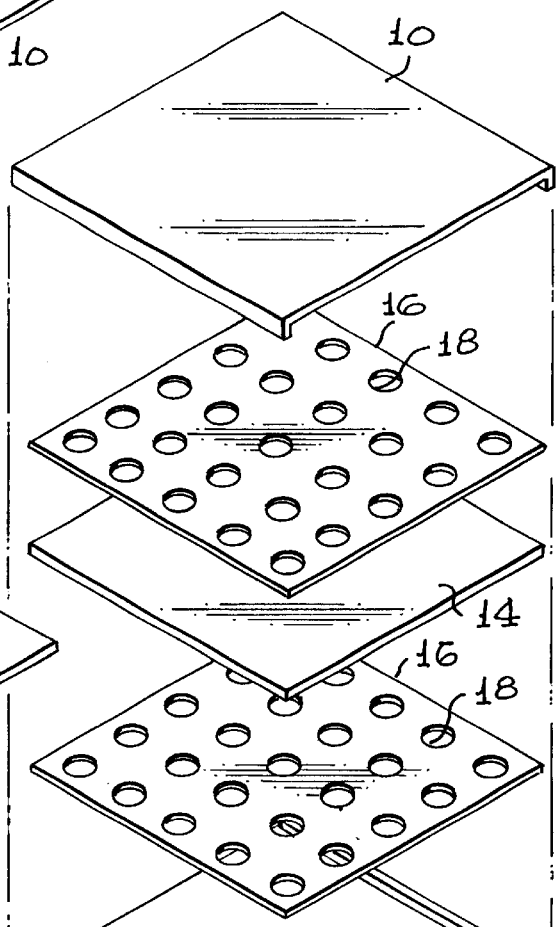

HIGH TEMPERATURE LAMINATED STRUCTURAL PANELS AND METHOD OF PRODUCING THE SAME

BACKGROUND OF THE INVENTION

The present invention is concerned with composite panels of all metal construction. All metal honeycomb panels are shown in U.S. Pat. No. 4,013,210. Applicant's U.S. Pat. No. 5,192,623 describes a process for producing laminated structural panels having considerable strength and resistance to bending. Such panels include alternate layers of flat sheets and perforated sheets with the flat sheets either clad with a brazing layer or with a separate brazing layer between the flat and perforated sheets. The sheets are stacked with the perforations aligned, if desired, then vacuum brazed to form a solid panel. Such panels are capable of further processing such as bending, stamping, drilling, or sawing without danger of delamination.

There are current requirements in processing machinery, particularly for the electronic chip and panel display industry, for structural panels which can be subjected to comparatively high temperatures (400–450° C.) and to significant loading without significant bending. For such applications, it is also necessary that the structural panels which support production of electronic panel displays operate at high temperature in a corrosive atmosphere without degassing or emitting particles which can contaminate the product.

SUMMARY OF THE INVENTION

The metal most commonly used for the above applications is aluminum. The major reason is that aluminum does not contaminate the product, such as electronic chips, with particles released under high vacuum, high temperature and chemically corrosive and/or plasma environment and it can be anodized. The problem with aluminum is that it loses its strength at elevated temperatures (above 250° C.). The machines that produce computer display panels require temperatures in the range of 400–450° C. and the productivity of these machines increases with higher temperatures.

The following description of the method for producing this type of new hybrid materials for the requirements described above will be concentrated mainly on aluminum and its alloys but similar methods and manufacturing procedures can be applied to other metals.

The basic concept of this invention is the insertion of high strength, high temperature layer material between layers of aluminum plates and brazing them to a single part. In order to have a continuous joint through the width of the part the high strength layer is perforated in order to enable braze alloy to penetrate through the perforations and create a uniform integrated structure. A second purpose for the perforations is to increase the elasticity of the high strength, high temperature perforated layer in order to match the difference in the thermal expansion coefficient of the two or more alloys. The thickness of the layers and the type of materials used should be carefully chosen with regard to the thickness, thermal expansion coefficient, type of perforations, the pattern, percent of the open area of the perforated layer and its placement in the stack in order to minimize distortion in the final assembly as a function of temperature.

Panels made as described herein using perforated high strength high temperature magnetic materials can be used in space station or space vehicle applications where magnetic properties are needed to walk in an essentially zero gravity or very low gravity environment using magnetic shoes. Such panels will add strength and magnetic properties to aluminum structures with minimum weight penalty. Such magnetic panels can also be used for packaging electronic equipment which is sensitive to electromagnetic interference (EMI) or electromagnetic pulse (EMP).

The high temperature, high strength perforated layers can be manufactured by several methods. For low and medium volume chemical etching, metal cutting laser or water jet is recommended. For high volume production, stamping or precision fine blanking are the preferred methods. When wire cloth is used, laser or a stamping die can be used.

The inner layer(s) which are machined or stamped from an aluminum plate are basically a center core material and are usually in the neutral region during bending and/or under compressive loads only. In some cases, an additional inner layer will be made from clad material in order to have sufficient thickness and/or braze material to fill all the perforated area/volume of the high strength layers.

Exterior layers can be produced from the same or a more expensive alloy than the inner core. In most cases this layer will be a clad layer with braze alloy rolled into it.

Once the individual plates are fabricated, the plates are chemically cleaned and stacked on top of each other as required. The type of brazing used will differ according to the type of metals utilized. Vacuum brazing is preferred in aluminum because it provides a cleaner and stronger joint. Brazing should be uniform and continuous across all the layers of the assembly. Multiple cycle brazing is also an option. In some cases, a portion of the layers are brazed first then reprocessed and additional secondary braze operations are performed, usually with lower temperatures and different braze alloys.

Following the brazing step, any quenching, straightening, stress relieving and/or aging steps may be required. Final matching of the exterior surfaces is done to establish final thickness parallelism and surface finish required.

BRIEF DESCRIPTION OF THE DRAWING(S)

This invention may be more clearly understood with the following detailed description and by reference to the drawings in which:

FIG. 1 is a perspective view of an external plate with side ribs used in producing reinforced aluminum plate;

FIG. 2 is a perspective view of an internal plate or plates used in producing reinforced aluminum plate according to the invention;

FIG. 3 is a perspective view of a high strength, high temperature perforated metal plate according to the invention;

FIG. 4 is an exploded view of the assembly used to produce a reinforced aluminum plate according to the invention;

DETAILED DESCRIPTION OF THE INVENTION

Figure 5:
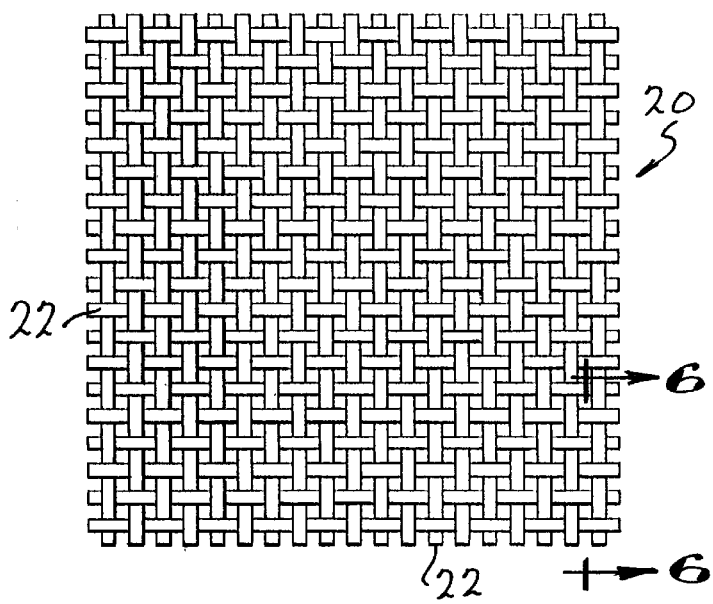
FIG. 5 is a front elevational view of a wire cloth layer that can replace the part shown in FIG. 3.

Referring now to FIG. 1, a perspective view of a solid external plate 10 with integral side rails 12 is shown. In most cases, side rails are not needed when the thickness of the high strength perforated layer (see FIG. 3) is small. Plate 10 may be formed by a number of methods including stamping or machining. In some cases it will include alignment holes for pins in order to locate each layer in the proper relation to each other. External plates may be made of any brazable aluminum alloy.

FIG. 2 is a perspective view of one of the internal plates 14 according to the invention. This plate is similar to the external plate. It can be produced by the same methods and may be made from the same material. The purpose of the internal plate 14 is to keep the high strength, high temperature layers apart and add thickness to the finished product. In some cases multiple inner layers will be used. Alignment holes for pins may be used in order to locate each layer in the proper relation to other layers. Inner plates 14 may be made of any brazable aluminum or may be clad both sides with braze material.

FIG. 3 is a perspective view of the high strength, high temperature plate 16 formed according to the invention. Materials chosen for plate 16 do not have to be braze compatible with the external or internal plates. In most cases these plates will be made of stainless steel, Inconel or other alloys. They can also be made of a magnetic alloy, as described above. The thickness of this plate 16 is preferably kept to a minimum (0.004" to 0.030"). Thicker layers can be used on larger parts or when needed. This plate is perforated to allow braze alloy to flow through the perforations and join the plates on both sides. In some cases plates 16 can be plated or ivadized with aluminum in order to promote wetting and brazing.

The shape, type and area of the perforations 18 in plate 16 have significant impact on the overall strength, stiffness and stability of the finished product. Perforation size, density, pattern and direction of pattern are very important to the final product. Larger clearance holes are provided in areas where holes will be drilled in the final product. These through holes are made larger in order to prevent exposing the high strength, high temperature alloy plate 16 during final machining or drilling. The volume of the braze alloy has to be sufficient to fill all the perforation volume that was removed from plate 16. This plate may also include holes for alignment pins. The perforated plates 16 must be somewhat similar in area to the external and internal plates 10 and 14 described above which overlap them so that subsequent machining or drilling steps do not expose areas of the perforated plates 16 to the high temperature, possibly corrosive, brazing atmosphere.

FIG. 4 is an exploded view showing the several layers of the stack in the order they are given prior to brazing.

As indicated above, the aluminum alloy layers 10 on top and bottom of the stack have little strength at temperatures in the range of 400–450° C. To provide the required strength and stiffness, the high strength, high temperature plate or plates 16 must be of a metal having little or no tendency to soften or bend at the above working temperatures. Examples of such materials are stainless steel or Inconel. Since aluminum has a greater temperature coefficient of expansion than either stainless steel or Inconel, there would be a tendency for the layers to delaminate when the composite panel is subjected to temperature changes in the range of 400° C. By providing perforations 18 in the high strength layer or layers 16 and causing the aluminum braze material to fill the volumes of the perforations, the strength panel becomes stretched by the numerous small aluminum posts extending through the perforations 18 and elongates to follow the temperature expansion of the aluminum alloy layers.

Figure 6:
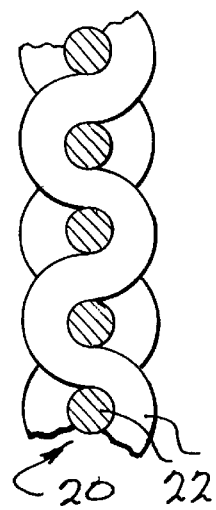
FIG. 6 is an edge view of the wire cloth layer of FIG. 5.

FIG. 5 is a top plan view of a panel of metal cloth 20 which may be used in place of the high strength, high temperature panels 16. The braze material will flow through the interstices between the individual wires 22 providing a high number of small posts between the layers 10 and 14. FIG. 6 is an edge view of the metal cloth of FIG. 5.

Figure 7:
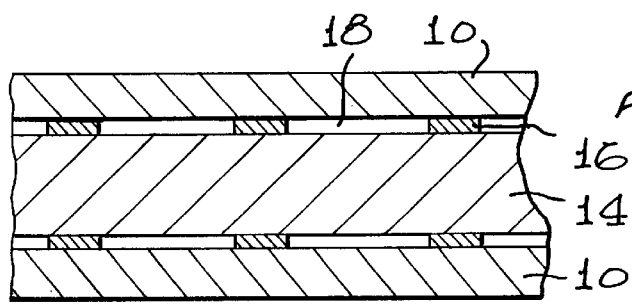
FIG. 7 is a sectional view through a stacked assembly made from the layers shown in FIG. 4.
Figure 8:
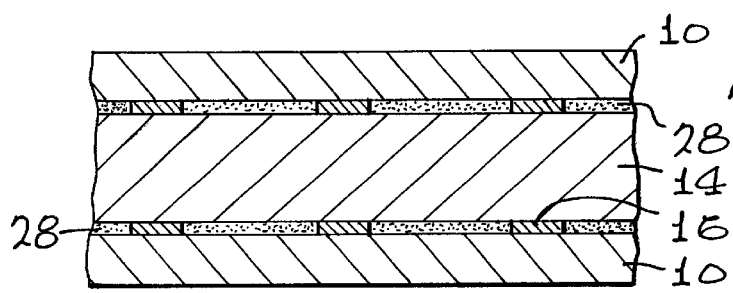
FIG. 8 is sectional view of the stacked assembly of FIG. 7 or 9 subsequent to brazing.

FIG. 7 is a cross sectional view taken through the stack of FIG. 4, as assembled. With the layers assembled as shown, the stack is subjected to brazing temperature of 595–620° C. This temperature will cause layer 14 to melt and become sufficiently liquid to flow into and substantially fill all of the perforations 18. Since top and bottom layers 10 are also largely of aluminum, the braze material from layer 14 will adhere securely to layers 10 thus forming a series of posts extending through perforations 18 and securely fixing the strength panels 16 in position. FIG. 8 is a cross section of the stack of FIG. 7 after the brazing operation. It will be observed that perforations 18 are filled with solidified braze material 28 from center layer 14. Some of the material from top and bottom layers 10 may also flow into perforations 18.

Figure 9:
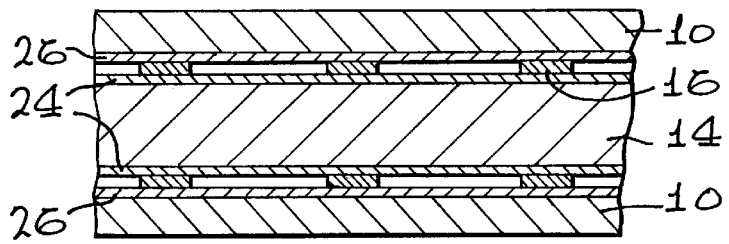
FIG. 9 is a sectional view of a stacked assembly similar to FIG. 7 using braze shim

FIG. 9 is a sectional view similar to FIG. 7 and differing only in that the braze layers 24 and 26 are shown attached to inner layer 14 and outer layers 10. After brazing the cross section of the stack of FIG. 9 would appear the same as in FIG. 8.

Those skilled in the art will recognize that many possible configurations of panels are possible using the teachings herein. Stiffness and density are variable depending upon the number and thickness of the intermediate perforated layers and the pattern of perforations in the layers. Various materials and combinations of materials are possible as set forth above; consequently I do not desire to be limited to the embodiments described but only by the following claims as interpreted with the benefit of the Doctrine of Equivalents.

What is claimed:

1. A laminated structural panel comprising:
   a perforated plate of high strength, high temperature metal; and
   top and bottom plates of metal having lower strength and stiffness than said perforated plate at temperatures over 250° C., each said top and bottom plate having a layer of braze material on the side adjacent said perforated plate;
   said top, bottom and perforated plates being brazed together in a high temperature, high vacuum atmosphere to cause said braze material to melt and substantially fill the perforations of said perforated plate.

2. A laminated structural panel as claimed in claim 1 wherein said top and bottom plates are of aluminum alloy.

3. A laminated structural panel as claimed in claim 1 wherein said top and bottom plates are formed larger than said perforated plate.

4. A laminated structural panel comprising:
   an intermediate plate of metal having low strength and stiffness at temperatures over 250° C. and having top and bottom surfaces of braze material;
   a perforated plate of high strength, high temperature metal on each side of said intermediate plate;
   top and bottom plates of metal alloy having low strength and stiffness at temperatures over 250° C. and having a layer of braze material on one side adjacent said perforated plates;
   said plates being brazed together in a high temperature, high vacuum atmosphere to cause said braze material to melt and substantially fill the perforations of said perforated plate.

5. A laminated structural panel as claimed in claim 4 wherein said intermediate plate is entirely of braze material.

6. A laminated structural panel as claimed in claim 4 wherein each of said top, bottom and intermediate plates is formed larger than said perforated plates.

7. A laminated structural panel as claimed in claim 4 wherein said intermediate plate is of aluminum alloy and said top and bottom plates are of a different aluminum alloy from said intermediate plate.

8. A laminated structural panel as claimed in claim 4 wherein said panel further comprises a plurality of said intermediate plates, one of said perforated plates is interleaved between adjacent pairs of said intermediate plates and between each of said top and bottom plates and one of said intermediate plates.

9. A laminated structural panel as claimed in claim 8 wherein at least some of said intermediate plates are entirely of braze material.

10. A laminated structural panel as claimed in claim 8 wherein said perforated plates are made of magnetic material.

11. A laminated structural panel as claimed in claim 8 wherein perforations in said perforated plates are of various sizes and shapes and include holes for alignment pins.

12. A process for manufacturing a laminated structural panel comprising:
   a) forming solid plates of a metal having low strength at high temperatures;
   b) forming a perforated plate of high strength, high temperature metal alloy;
   c) stacking said high strength perforated plate between said plates of low strength material;
   d) brazing said plates together so as to cause braze material to melt and substantially fill the perforations of said perforated plates to form a unitary assembly.

13. The process as claimed in claim 12 wherein a braze shim layer is positioned between adjacent said plates.

14. The process as claimed in claim 12 wherein a plurality of said high strength, high temperature plates are formed, said stack includes an internal plate of brazing material placed between each of said high strength, high temperature plates, and during the brazing step braze material flows into the perforations in said high strength, high temperature plates from said internal plate and said shim layers.

15. The process as claimed in claim 12 wherein step d) is a vacuum brazing process.

16. A process as claimed in claim 12 wherein said perforated high strength, high temperature plate is made of metal cloth.

17. The process as claimed in claim 14 wherein following step d) all exterior surfaces of the brazed assembly are machined to required dimensions.

18. A process for manufacturing a laminated structural panel comprising:
   a) forming a plurality of external plates of aluminum alloy;
   b) forming a plurality of plates of perforated metal of high strength, high temperature metal alloy;
   c) forming an internal solid aluminum alloy plate;
   d) stacking said plates with said solid internal aluminum alloy plate between said perforated metal plates with said external plates on each end of said stack;
   e) brazing said plates together so as to cause braze material to melt and substantially fill the perforations of said perforated plates to form a unitary assembly; and
   f) machining all exterior surfaces of the brazed assembly to required dimensions.

19. The process as claimed in claim 18 wherein the plate of step c) is clad both sides with braze material.

20. The process as claimed in claim 18 wherein step e) is a vacuum brazing process.

21. The process as claimed in claim 18 wherein said external plates are of a different aluminum alloy than said internal aluminum alloy plate.

22. The process as claimed in claim 18 wherein during the brazing step said aluminum alloy plates tend to expand with temperature at a greater amount than said perforated plates and said braze material in the perforations of said perforated plate tend to elongate said perforated plates such that they remain brazed to said aluminum alloy plates.

23. The process of claim 18 wherein braze shim material is placed between said external plates and said plates of perforated metal.

* * * * *